(12) United States Patent
Egami et al.

(10) Patent No.: US 10,347,685 B2
(45) Date of Patent: Jul. 9, 2019

(54) OPTICAL DEVICE AND METHOD FOR MANUFACTURING SAME

(71) Applicant: Kabushiki Kaisha Toshiba, Minato-ku (JP)

(72) Inventors: Takao Egami, Kamakura (JP); Atsushi Hosokawa, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/698,840

(22) Filed: Sep. 8, 2017

(65) Prior Publication Data
US 2018/0240839 A1   Aug. 23, 2018

(30) Foreign Application Priority Data

Feb. 21, 2017   (JP) .................. 2017-029924

(51) Int. Cl.
*H01L 27/146*    (2006.01)
*G01J 1/04*      (2006.01)
(Continued)

(52) U.S. Cl.
CPC .......... *H01L 27/14649* (2013.01); *G01J 1/04* (2013.01); *G01J 5/024* (2013.01); *H01L 23/29* (2013.01); *H01L 23/31* (2013.01); *H01L 27/1462* (2013.01); *H01L 27/14618* (2013.01); *H01L 31/02* (2013.01); *H01L 27/14625* (2013.01); *H01L 2224/48091* (2013.01); *H01L 2224/48247* (2013.01); *H01L 2924/1815* (2013.01)

(58) Field of Classification Search
CPC ... H01L 27/14649; H01L 23/29; H01L 23/31; H01L 31/02; H01L 27/14618; H01L 27/1462; H01L 2224/48091; H01L 2924/1815; H01L 2224/48247; H01L 27/14625; G01J 5/024; G01J 1/04
See application file for complete search history.

(56) References Cited

U.S. PATENT DOCUMENTS 6,525,405 B1 * 2/2003 Chun .................. H01L 21/4828
                                          174/538
7,582,954 B1 * 9/2009 Lim ....................... H01L 21/568
                                          257/433
(Continued)

FOREIGN PATENT DOCUMENTS

JP   2006-145501   6/2006

*Primary Examiner* — Su C Kim
(74) *Attorney, Agent, or Firm* — Oblon, McClelland, Maier & Neustadt, L.L.P.

(57) ABSTRACT

An optical device includes a substrate, a semiconductor chip, a resin member, and a transparent plate. The semiconductor chip is provided on the substrate, and an optically functional layer is formed in a part of a top portion of the semiconductor chip. The resin member is provided on the substrate with a top surface and an inner side surface, and has a frame shape surrounding the optically functional layer. The resin member is integrally formed from a resin material, and includes a recessed portion provided at the intersection of the top surface and the inner side surface. The transparent plate is disposed in the recessed portion. The semiconductor chip, the resin member, and the transparent plate are arranged to define airspace.

8 Claims, 4 Drawing Sheets

(51) Int. Cl.
    *H01L 23/29*     (2006.01)
    *H01L 23/31*     (2006.01)
    *H01L 31/02*     (2006.01)
    *G01J 5/02*     (2006.01)

(56) References Cited

U.S. PATENT DOCUMENTS

| | | | |
|---|---|---|---|
| 9,355,870 B1 * | 5/2016 | Pavelka | H01L 21/565 |
| 9,722,098 B1 * | 8/2017 | Chung | H01L 31/0203 |
| 2006/0091515 A1 * | 5/2006 | Weng | H01L 27/14618 |
| | | | 257/680 |
| 2008/0164413 A1 | 7/2008 | Shibayama | |
| 2015/0230028 A1 * | 8/2015 | Park | H04R 19/005 |
| | | | 381/174 |

\* cited by examiner

OPTICAL DEVICE AND METHOD FOR MANUFACTURING SAME

CROSS-REFERENCE TO RELATED APPLICATIONS

This application is based upon and claims the benefit of priority from Japanese Patent Application No. 2017-029924, filed on Feb. 21, 2017; the entire contents of which are incorporated herein by reference.

FIELD

Embodiments relate to an optical device and a method for manufacturing the same.

BACKGROUND

An infrared sensor for vehicles has been developed recently as one of techniques for realizing autonomous vehicles. The infrared sensor is manufactured through steps of mounting a semiconductor chip on a substrate with a light receiving element formed on the semiconductor chip, and disposing a glass plate on the light receiving element. Since there is a demand for mounting many infrared sensors on the automobile to realize autonomous driving, it is required to reduce a cost of the infrared sensor.

DETAILED DESCRIPTION

According to one embodiment, an optical device includes a substrate, a semiconductor chip, a resin member, and a transparent plate. The semiconductor chip is provided on the substrate. An optically functional layer is formed in a part of a top portion of the semiconductor chip. The resin member is provided on the substrate. The resin member has a frame shape surrounding the optically functional layer, and a recessed portion is formed at an intersection of a top surface and an inner side surface of the resin member. The resin member is integrally formed from a resin material. The transparent plate is disposed in the recessed portion. The semiconductor chip, the resin member, and the transparent plate are arranged to define airspace.

According to another embodiment, a method for manufacturing an optical device includes mounting a semiconductor chip on a substrate. An optically functional layer is formed in a part of a top portion of the semiconductor chip. The method includes touching a second protruding portion of a jig to a region surrounding the optically functional layer in a top surface of the semiconductor chip. The jig has a base, a first protruding portion, and the second protruding portion. The first protruding portion is provided on a bottom surface of the base, and the second protruding portion is provided on a bottom surface of the first protruding portion. The method includes filling a space between the substrate and the jig with a liquid phase resin material while keeping the jig in contact with the semiconductor chip. The method includes forming a resin member by curing the liquid phase resin material. The method includes separating the jig from the substrate, the semiconductor chip and the resin member. The method includes placing a transparent plate in a recessed portion of the resin member. The recessed portion corresponds to the first protruding portion.

Hereinafter, an embodiment will be described with reference to the drawings.

Figure 1:
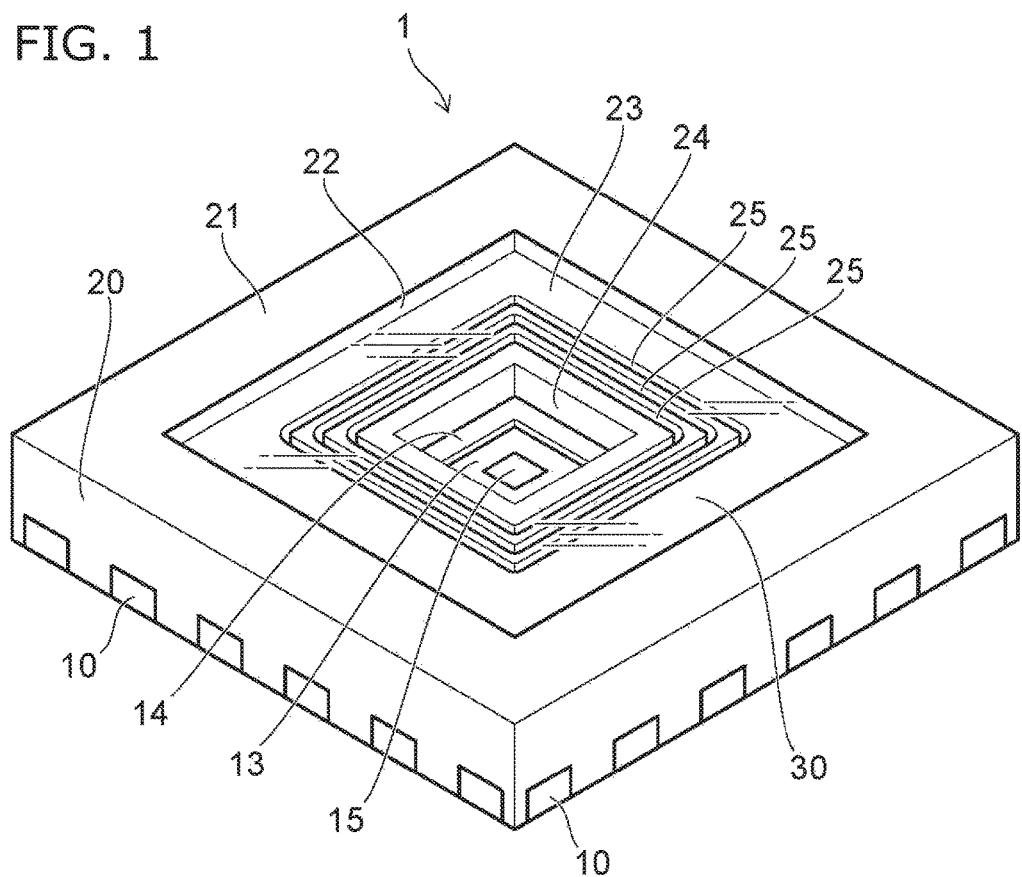
FIG. 1 is a perspective view showing an optical device according to an embodiment.

FIG. 1 is a perspective view showing an optical device according to the embodiment.

Figure 2:
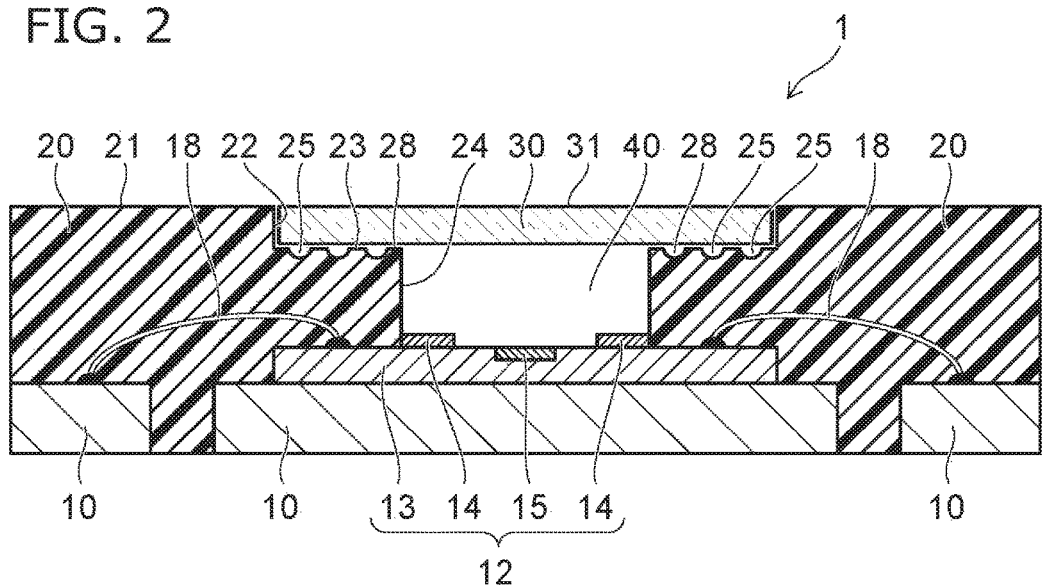
FIG. 2 is a cross-sectional view showing the optical device according to the embodiment.

FIG. 2 is a cross-sectional view showing the optical device according to the embodiment.

Figure 3:
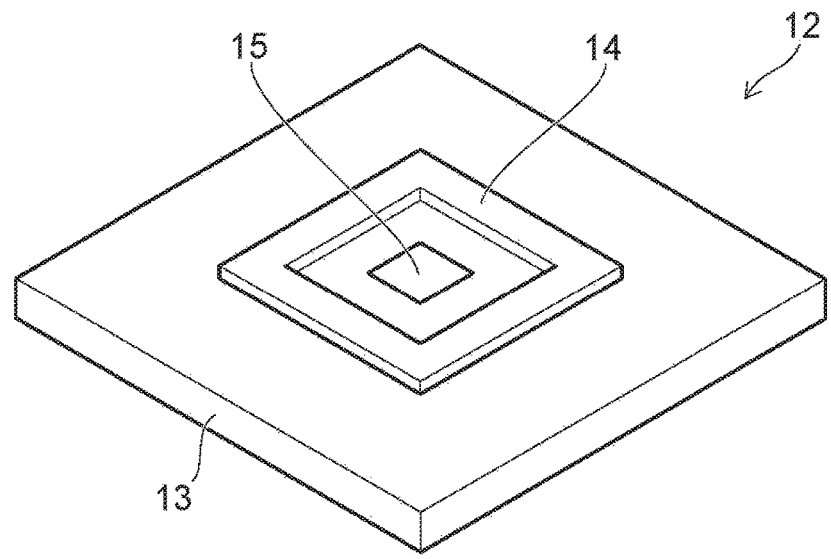
FIG. 3 is a perspective view showing a silicon chip of the optical device according to the embodiment.

FIG. 3 is a perspective view showing a silicon chip of the optical device according to the embodiment.

The optical device according to the embodiment is a light sensor such as an infrared sensor.

As shown in FIGS. 1 and 2, a substrate 10 is provided in the optical device 1 according to the embodiment. The substrate 10 is made of copper, for example, and patterned into a predetermined shape of interconnection. A silicon chip 12 is provided on the substrate 10. Wirings 18 are connected to the substrate 10 and pads (not shown) provided in the silicon chip 12. Note that illustration of wirings 18 is omitted in FIG. 1.

As shown in FIG. 3, a silicon base 13 and a guard ring 14 made of metal are provided in the silicon chip 12. The silicon base 13 has a shape like a rectangular plate. The silicon base 13 is made of, for example, single crystal silicon, and an infrared detection layer 15 is formed in a part of a top portion of the silicon base 13. The infrared detection layer 15 is an optically functional layer that converts the incident infrared rays into electric signals. When viewed from above, the infrared detection layer 15 is disposed in the central portion of the silicon base 13. Moreover, circuit elements (not shown) such as insulating members, interconnections, bonding pads, active elements, and passive elements are provided on the top portion of the silicon base 13.

The guard ring 14 is provided on the top surface of the silicon base 13, and is in contact with the silicon base 13. The guard ring 14 is, for example, made of copper, and is formed, for example, by plating. The guard ring 14 has, a thickness of several microns, for example. When viewed from above, the guard ring 14 has a shape like frame surrounding the infrared detection layer 15. The top surface of the guard ring 14 is positioned at a level above the top surface of the silicon base 13.

As shown in FIG. 1 and FIG. 2, a resin member 20 is provided on the substrate 10. The resin member 20 is integrally formed from resin material. The resin member 20 has some portions located in the spaces of the patterned substrate 10. The resin member 20 has the bottom surface in plane with the bottom surface of the substrate 10, and has the side surface in plane with the side surface of the substrate 10. The wirings 18 are positioned in the resin member 20.

A recessed portion 22 is formed in the central portion of the top surface 21 of the resin member 20. The recessed portion 22 has, for example, a shape like rectangular parallelepiped. A through hole 24 is formed in the central portion of the bottom surface 23 of the recessed portion 22. The through hole 24 has, for example, a shape like rectangular parallelepiped. The through hole 24 extends through the resin member 20, and the infrared detection layer 15 and the guard ring 14 are exposed at the bottom of the through hole 24. In other words, the resin member 20 has a shape like frame surrounding the infrared detection layer 15, and the recessed portion 22 is provided at a portion where the inner surface intersects with the top surface. One or more grooves 25, for example, three grooves 25 are formed on the bottom surface of the recessed portion 22, which surrounds the through hole 24. When viewed from above, the grooves 25 have a shape like rectangle that surrounds the through hole 24, and has rounded corners.

A transparent glass plate 30 is provided in the recessed portion 22 of the resin member 20. Here, "Transparent" includes translucence. The glass plate 30 has a shape like a rectangular plate that is just accommodated in the recessed portion 22. The glass plate 30 has a thickness equal to or less than the depth of the recessed portion 22. Thus, the top surface 31 of the glass plate 30 is positioned at a level same as or lower than the top surface 21 of the resin member 20. An adhesive layer 28 is provided between the bottom surface of the recessed portion 22 and the glass plate 30. The adhesive layer 28 includes portions located in the grooves 25.

The resin member 20 is in contact with the top surface of the substrate 10, excluding the area where the silicon chip 12 is in contact with the top surface of the substrate 10, and the resin member 20 is also in contact with inner side surfaces of the patterned substrate 10, a peripheral portion of the top surface of the silicon chip 12, side surfaces of the silicon chip 12, the wirings 18 and the glass plate 30.

Inside the through hole 24 of the resin member 20, airspace 40 is provided. The airspace 40 is defined by the silicon chip 12, the resin member 20, and the glass plate 30. In the airspace 40, exposed are the top surface of the silicon base 13 including the infrared detection layer 15, the guard ring 14, the resin member 20, and the glass plate 30. For example, the air airspace 40 is hermetically sealed. The optical device 1 has the outer surface configured by the surfaces of the substrate 10, the resin member 20, and the glass plate 30.

A method for manufacturing the optical device according to the embodiment will be described below.

FIGS. 4 to 7 are cross-sectional views showing the manufacturing method of the optical device according to the embodiment.

In the embodiment, the method of collectively manufacturing a plurality of optical devices 1 will be described as an example.

The substrate 10 shown in FIG. 2 is prepared. A plurality of mounting areas, on which the silicon chips 12 are mounted, are provided on the substrate 10 with a matrix-like arrangement. In addition, a plurality of silicon chips 12 shown in FIG. 3 are prepared.

Figure 4:
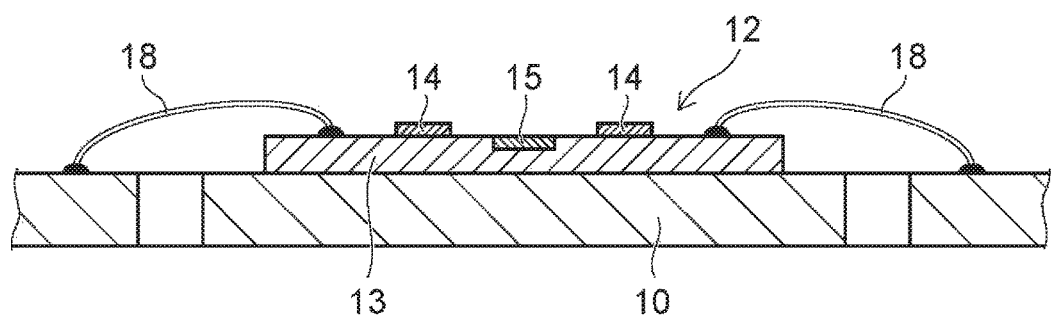
FIGS. 4 to 7 are cross-sectional views showing a manufacturing method of the optical device according to the embodiment.

Then, a silicon chip 12 is mounted on the mounting area of the substrate 10 as shown in FIG. 4. Subsequently, a wiring 18 is connected to a bonding pad of the silicon chip 12 (not shown) and the substrate 10.

Figure 5:
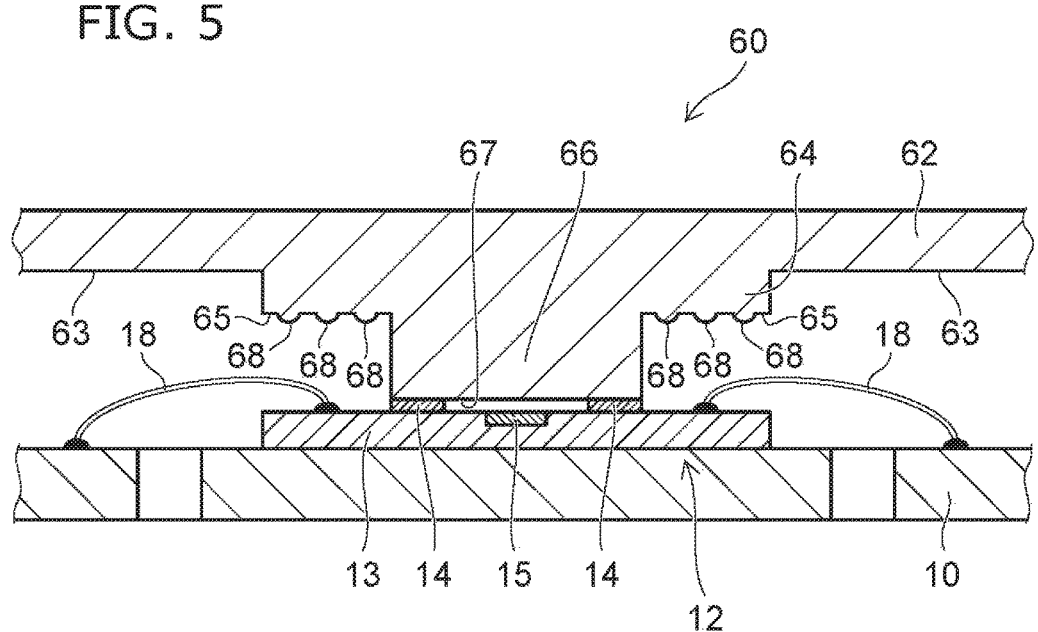

A jig 60 is prepared as shown in FIG. 5. The jig 60 includes a plate-shaped base 62, and a first protruding portion 64 formed so as to protrude downward from the bottom surface 63 of the plate-shaped base 62. The first protruding portion 64 has a shape like rectangular parallelepiped. The first protruding portion 64 has a step height equal to or greater than the thickness of the glass plate 30. A plurality of first protruding portions 64 are formed corresponding to the silicon chips 12 mounted on the substrate 10. A second protruding portion 66 is provided on the central portion of the first protruding portion 64 so as to protrude from the bottom surface 65 of the first protruding portion 64. The second protruding portion 66 has a shape like rectangular parallelepiped, and a flat bottom surface 67. Rail-shaped minute projections 68 are formed in the bottom surface 65 of the first protruding portion 64. The minute projections 68 have a height lower than the step height of the second protruding portion 66. When viewed from below, the minute projections 68 have a shape like rectangle that surrounds the second protruding portion 66, and has rounded corners.

Then, the jig 60 is brought into abutting contact with the silicon chip 12. Specifically, the bottom surface 67 of the second protruding portion 66 of the jig 60 is brought into contact with the top surface of the guard ring 14 of the silicon chip 12. At this time, since the top surface of the guard ring 14 is positioned at a level above the top surface of the infrared detection layer 15, the jig 60 does not contact the infrared detection layer 15. That is, a minute gap is formed between the top surface of the infrared detection layer 15 and the bottom surface 67 of the second protruding portion 66 of the jig 60.

Figure 6:
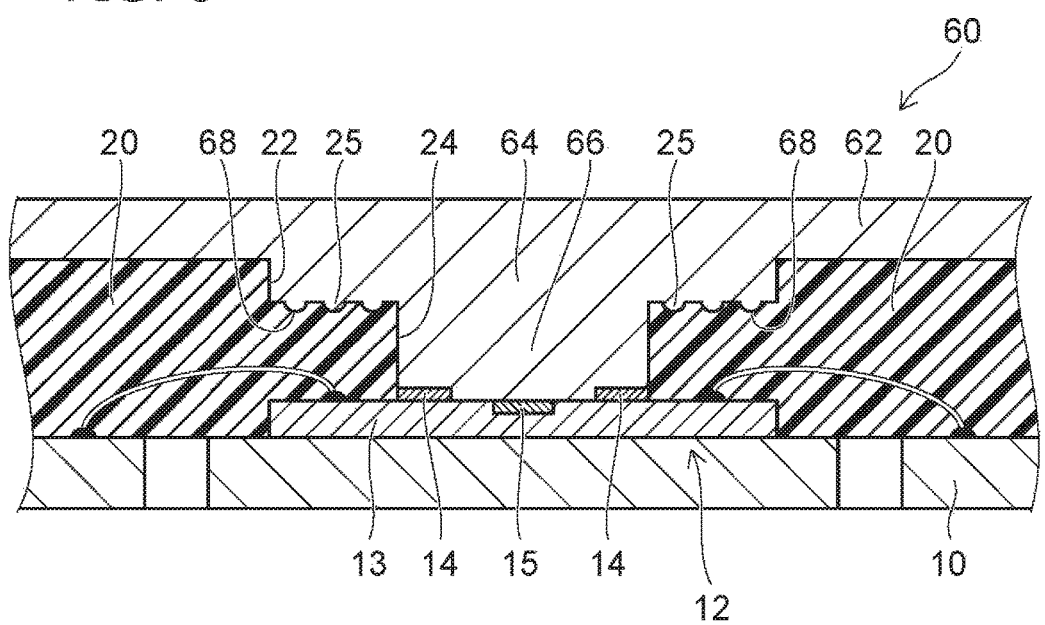

Then, as shown in FIG. 6, while keeping the jig 60 in contact with the silicon chip 12, liquid phase resin material is caused to flow into and fill a space between the substrate 10 and the jig 60. At this time, the resin material is prevented from flowing into the space inside the guard ring 14, since the guard ring 14 is made of soft metal such as copper, and thus adheres tightly to the jig 60. Thereby, it is possible in the infrared detection layer 15 to avoid contamination by the resin material. Moreover, it is possible to suppress damage to the silicon chip 12, since the guard ring 14 made of the soft metal acts as shock absorber when the jig 60 is brought into contact with the silicon chip 12.

Then, the resin material is cured, for example, by heat treatment, thereby, forming the resin member 20. In the resin member 20, the recessed portion 22 portion corresponds to the first protruding portion 64 of the jig 60, and the through hole 24 corresponds to the second protruding portion 66 of the jig 60. The grooves 25 correspond to the minute projections 68 of the jig 60.

Figure 7:
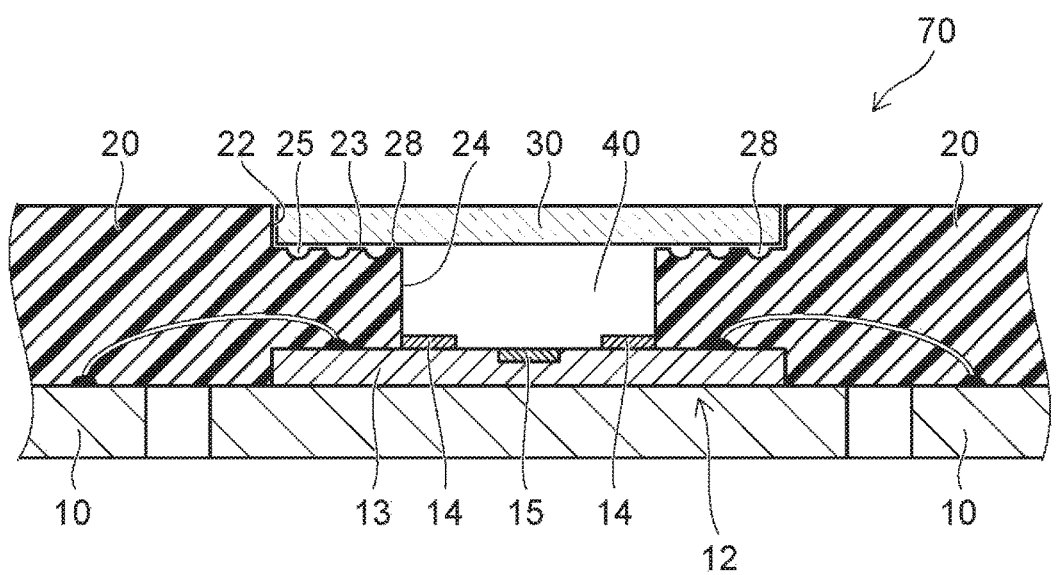

Then, as shown in FIG. 7, the jig 60 (see FIG. 6) is separated from the intermediate structure 70, which includes the substrate 10, the silicon chip 12, the wirings 18, and the resin member 20.

Next, an adhesive is applied to the bottom surface 23. At this time, a part of the adhesive is provided in the groove 25.

Then, the glass plate 30 is placed in the recessed portion 22. At this time, it is possible to prevent the adhesive from overflowing into the through hole 24, when a sufficient amount of the adhesive is applied to adhere the glass plate 30 to the resin member 20, and the glass plate 30 is pressed thereto, since the part of the adhesive remains in the groove 25. Thus, the wide allowable range is achieved for the application amount of the adhesive.

Then, the adhesive is solidified to form the adhesive layer 28. Thereby, the glass plate 30 is bonded to the bottom surface 23 of the resin member 20 via the adhesive layer 28. As a result, the through hole 24 of the resin member 20 is sealed by the glass plate 30 so as to form the airspace 40.

Then, as shown in FIGS. 1 and 2, the substrate 10 and the resin member 20 are diced into pieces. Thereby, a plurality of optical devices 1 are manufactured.

Advantages of the embodiment will be described below.

In the embodiment, the resin member 20 is formed in the step shown in FIG. 6 by filling the space between the substrate 10 and the jig 60 with the resin material while the jig 60 is in contact with the silicon chip 12 mounted on the substrate 10. At this time, the recessed portion 22 is formed by the first protruding portion 64 of the jig 60, and the through hole 24 is formed by the second protruding portion

66. The grooves 25 are formed by the minute protrusions 68. In this manner, since the resin member 20 with the recessed portion 22, the through holes 24 and the grooves 25 is formed in the single step, the optical device 1 can be manufactured with high efficiency.

When making a member having a shape same as the shape of the resin member 20 by assembling a plurality of components, the parts cost increases as the number of components increases, and the manufacturing cost also increases due to the precise assembly process required therefor.

Further, in the step shown in FIG. 7, the glass plate 30 can be placed in a self-aligning manner by inserting the glass plate 30 into the recessed portion 22 of the resin member 20. Thus, it is possible to place the glass plate 30 without a procedure for precisely arranging, thereby making the manufacturing cost lower.

Furthermore, since, in the embodiment, it is possible to easily form the airspace 40 without the precise alignment through the process of forming the through hole 24 by the second protruding portion 66 of the jig 60, and placing the glass plate 30 in the recessed portion 22 of the resin member 20. Thus, the airspace 40 can be formed with a smaller size. This makes it possible to suppress the force applied to the glass plate 30 and to prevent the glass plate 30 from destruction, when an air-pressure difference increases between the inside of the airspace 40 and the external environment due to a temperature change or a change in atmospheric pressure in the external environment.

Further, by making the airspace 40 smaller, the glass plate 30 can also be reduced in size. Thereby, the cost of the optical device 1 can be reduced, and the generation of thermal stress due to a difference in the linear expansion coefficient between the resin member 20 and the glass plate 30 can be suppressed when temperature changes. As a result, it is possible to avoid the destruction of the glass plate 30 due to the temperature change.

The advantages described above, that is, enhancing resistance to the atmospheric pressure change and the temperature change by reducing the airspace size 40 is significant when the optical device 1 is installed on an automobile. For example, it is possible to prevent the glass plate 30 from being damaged when the atmospheric pressure or the temperature rapidly changes as the altitude changes or the weather changes. Thus, the optical device 1 obtains high reliability.

Moreover, in the embodiment, since the jig 60 is brought into contact with the soft guard ring 14 in the step shown in FIG. 5, the impact on the silicon chip 12 can be alleviated. Thereby, the damage to the silicon chip 12 due to the abutment of the jig 60 can be suppressed.

Further, since the jig 60 is brought into abutting contact with the soft guard ring 14, the tightly sealing is achieved between the jig 60 and the guard ring 14. Thereby, in the step shown in FIG. 6, it is possible to suppress the resin material from penetrating into the inside of the guard ring 14. Thus, it is possible to prevent infrared ray, which is incident on the infrared detection layer 15, from being blocked by the resin material. As a result, the optical device 1 according to the embodiment may be manufactured with high yield.

Furthermore, since the guard ring 14 can be formed using a common process of forming wiring, such as a plating method. Thus, the guard ring 14 is easily formed with low cost of the manufacturing.

It should be noted that when the guard ring 14 is not provided, a blocking member is necessary to prevent liquid phase resin material from flowing over the infrared detection layer 15. However, providing such a blocking member increases the number of components, thus increasing the cost for components. In addition, the manufacturing cast also increases, since a step of placing the blocking member in an appropriate position is necessary.

Furthermore, in the embodiment, the grooves 25 are formed in the bottom surface 23. In the step shown in FIG. 7, where adhesive is applied to the bottom surface 23, part of the adhesive stays in the grooves 25. Thereby, when an amount of adhesive sufficient to adhere the glass plate 30 to the resin member 20 is applied, it is possible to suppress the overflowing of adhesive into the through hole 24. Thus, according to the embodiment, it is possible to secure the adhesive strength of the glass plate 30, and further, the widened allowable range of the applying amount of adhesive makes the manufacturing process of the optical device 1 easier.

Furthermore, in the embodiment, since the thickness of the glass plate 30 is equal to or less than the depth of the recessed portion 22, the glass plate 30 is placed without protruding from the top surface 21 of the resin member 20. Thereby, when a person touches the optical device 1, damaging the fingertip by the edge of the glass plate 30 may occur with low possibility. When the glass plate 30 protrudes from the top surface 21 of the resin member 20, it is necessary to chamfer the edge of the glass plate, thus increasing the manufacturing cost.

Note that the embodiment is an example in which the optical device 1 is an infrared sensor, and is not limited thereto. The optical device 1 may be, for example, a visible light sensor or an ultraviolet sensor. Further, the optical device 1 may be a light emitting device.

According to the above-described embodiment, it is possible to achieve an optical device capable of reducing cost and a manufacturing method thereof.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optical device comprising:
   a substrate;
   a semiconductor chip provided on the substrate, an optically functional layer being formed in a part of a top portion of the semiconductor chip;
   a resin member provided on the substrate and having a frame shape surrounding the optically functional layer, the resin member being integrally formed from a resin material, a recessed portion being formed at an intersection of a top surface and an inner side surface of the resin member;
   a transparent plate disposed in the recessed portion; and
   an adhesive layer bonding the transparent plate to the resin member,
   the semiconductor chip includes
      a semiconductor portion in which the optically functional layer is formed, and
      a guard ring provided on a top surface of the semiconductor portion, surrounding the optically functional layer when viewed from above, and being made of metal, the semiconductor chip, the resin member, and the transparent plate being arranged to define airspace, a groove being formed on a bottom surface of the recessed portion, a portion of the adhesive layer being disposed in the groove, and the guard ring being in contact with the resin member and disposed in the airspace.

2. The optical device according to claim 1, wherein the groove has a rectangle shape with a rounded corner when viewed from above, and surrounds the optically functional layer.

3. The optical device according to claim 1, wherein the transparent plate has a thickness equal to or less than a depth of the recessed portion.

4. The optical device according to claim 1, wherein the optically functional layer is a light receiving layer converting input light into an electric signal.

5. A method for manufacturing an optical device, the method comprising:

mounting a semiconductor chip on a substrate, an optically functional layer being formed in a part of a top portion of the semiconductor chip, the semiconductor chip including a semiconductor portion and a guard ring made of metal, the optically functional layer being provided in the semiconductor portion, and the guard ring being provided on the top surface of the semiconductor portion, and surrounding the optically functional layer;

bringing a jig into abutting contact with the semiconductor chip, the jig including a base, a first protruding portion provided on a bottom surface of the base, a second protruding portion provided on a bottom surface of the first protruding portion , and a third protruding portion provided in a region surrounding the second protruding portion on the bottom surface of the first protruding portion, a height of the third protruding portion being lower than a height of the second protruding portion, wherein the second protruding portion is brought into contact with an upper surface of the guard ring when abutting the jig against the semiconductor chip;

filling a space between the substrate and the jig with a liquid phase resin material while keeping the jig in contact with the semiconductor chip;

forming a resin member by curing the liquid phase resin material, the resin member including a recessed portion corresponding to the first protruding portion;

separating the jig from the substrate, the semiconductor chip, and the resin member;

attaching adhesive on a bottom surface of the recessed portion of the resin member; and placing a transparent plate in the recessed portion.

6. The method according to claim 5, wherein the third protruding portion has a rectangle shape surrounding the second protruding portion and having a rounded corner.

7. The method according to claim 5, wherein a height of the first protruding portion is equal to or larger than a thickness of the transparent plate.

8. The method according to claim 5, wherein the optically functional layer is a light receiving layer converting input light into an electric signal.

* * * * *